United States Patent [19]
Woodward

[11] Patent Number: 5,854,937
[45] Date of Patent: Dec. 29, 1998

[54] METHOD FOR REPROGRAMMING FLASH ROM IN A PERSONAL COMPUTER IMPLEMENTING AN EISA BUS SYSTEM

[75] Inventor: James S. Woodward, Austin, Tex.

[73] Assignee: Dell U.S.A., L.P., Round Rock, Tex.

[21] Appl. No.: 712,382

[22] Filed: Sep. 11, 1996

Related U.S. Application Data

[63] Continuation of Ser. No. 223,890, Apr. 6, 1994.

[51] Int. Cl.[6] .................................................. G06F 12/00
[52] U.S. Cl. ................... 395/800.01; 395/733; 395/712; 395/280; 711/163
[58] Field of Search ......................... 395/800.01, 800.32, 395/830, 834, 868, 733, 280, 701, 712, 376, 163, 182.06; 365/189.02, 230; 380/3, 4; 326/8, 9

[56] References Cited

U.S. PATENT DOCUMENTS

| | | | |
|---|---|---|---|
| 5,239,621 | 8/1993 | Brown, III et al. ..................... | 395/115 |
| 5,388,267 | 2/1995 | Chan et al. .............................. | 395/652 |
| 5,390,256 | 2/1995 | Mandell et al. .......................... | 381/77 |
| 5,448,521 | 9/1995 | Curry et al. ....................... | 365/189.02 |
| 5,574,866 | 11/1996 | Smith et al. .............................. | 395/285 |
| 5,687,379 | 11/1997 | Smith et al. .............................. | 395/726 |

*Primary Examiner*—Alpesh M. Shah
*Attorney, Agent, or Firm*—Haynes and Boone, L.L.P.

[57] ABSTRACT

There is disclosed a method for reprogramming a 5 volt flash ROM, which includes EISA configuration code and boot code stored together in the same sector. The method of the present invention includes determining the type of flash ROM being used, and performing steps necessary to preserve the boot code while permitting reprogramming of the EISA configuration code. The method of the present invention includes modifying the conventional interrupt routine (Interrupt 15) that is used to set up and configure newly added expansion boards in an EISA bus system. The modified routine monitors the interrupt functions to determine if an erase or write is requested to the EISA configuration block in flash ROM. If an erase or write is detected, specific routines are initiated to enable the CPU to enter a protected mode to perform the necessary command sequences to the 5 volt flash ROM. In addition, necessary steps are taken to prevent the erasure of the boot code or other information in the sector that is not related to EISA configuration code during erase operations, and to prevent overwriting the boot code during write operations.

18 Claims, 7 Drawing Sheets

METHOD FOR REPROGRAMMING FLASH ROM IN A PERSONAL COMPUTER IMPLEMENTING AN EISA BUS SYSTEM

This is a continuation of copending application Ser. No. 08/223,890 filed on Apr. 6, 1994.

RELATED APPLICATIONS

This application relates generally to commonly owned and invented U.S. application Ser. No. 08/189,534, filed Jan. 31, 1994, entitled "Method for Reprogramming Flash ROM," the teachings of which are incorporated by reference herein.

FIELD OF THE INVENTION

The present invention relates generally to a read-only memory ("ROM") device used in a personal computer ("PC") to store system software, including basic input/output system ("BIOS") functions and initialization programs for the PC. More specifically, the present invention relates to a type of ROM generally known as "flash" ROM, which can be reprogrammed as the PC system is modified or upgraded. Still more particularly, the invention relates to a method for reprogramming a flash ROM in a personal computer that implements an EISA (Extended Industrial Standard Architecture) bus system, and which stores EISA configuration code in the same sector of ROM as other programs.

BACKGROUND OF THE INVENTION

Personal computer systems typically include several different storage components to store programs and data. These storage components include memory devices that form part of the PC, such as random access memory (RAM) and nonvolatile read-only memory (ROM), and memory devices that are located external to the PC system, such as storage disks (both hard disks and floppy disks). To load an operating system on a PC, it is necessary to initialize or "boot" the system by loading and executing boot code. Because the PC typically is unable to access external devices until after it is booted, it is necessary to store the boot code internally so that it can be readily accessed by the PC to initialize the system.

Of the two types of memory devices (ROM and RAM) that are located internally to the PC, it is generally preferable to use ROM to store the initialization and basic operating programs for the PC. Data can only be stored in and retrieved from RAM as long as a minimum threshold voltage remains supplied to that device. When power is removed from the RAM device, all data in RAM is lost. By contrast, instructions and other data stored in ROM are retained even when power to the ROM is turned off. As a result, boot code and other initialization and basic operating programs typically are stored in ROM.

One type of ROM commonly used today is termed "flash ROM." A flash ROM may be programmed by a user, and once programmed, will retain those instructions until subsequently erased. Normally, to alter the information stored in flash ROM, the old information must first be erased. After the contents of flash ROM are erased, the flash ROM may be reprogrammed with new code or data. Flash ROM therefore prevents stored information from being inadvertently written over, and, like other types of ROM, flash ROM retains data even when the system is powered down. Because of these and other features, flash ROM devices have become very popular in PC systems for storing certain critical instructions or code.

Some of the types of information typically stored in flash ROM include: (1) boot code; (2) Ediag information; (3) the main BIOS; and (4) EISA configuration information. In general, the boot code can be program code for system initialization, such as that needed to boot the central processing unit ("CPU"), which controls the operation of the PC system. Boot code typically requires minimal or the least amount of updating. Because the boot code essentially initiates operation of the PC system, it is important that the contents of the boot code not be altered accidentally when reprogramming the flash ROM. The Ediag information comprises diagnostic instructions enabling the CPU to perform self-diagnosis routines to detect system errors. As such, some or all of the contents of the Ediag code may be changed periodically. The main BIOS includes the application or program code itself, and may include data as well. The BIOS also may be reprogrammed periodically.

The EISA configuration code comprises information relating to the operation of the system bus and certain components that may be added to the system bus through expansion slots. In addition to accommodating add-on components, EISA systems provide expedited transfer of address and data signals through an expanded bus architecture. One of the methods that is used to expedite the transfer of data and address signals is to provide bus master capabilities, which permit operation of the system bus by components other than the main CPU. As a result, the CPU may be located on a plug-in processor card that is separate from the motherboard. In addition, other EISA cards may be plugged into the motherboard to enhance system performance, including bus controllers, hard drive controllers, graphics cards, interface cards, network cards, and the like. Because of the various cards that can be added to the EISA bus system, EISA specifications have been implemented to provide an industry standard for the EISA bus and EISA cards. The EISA configuration information stored in flash ROM relates to configuration information which is used to initialize the motherboard and the expansion boards. Because boards may be added or changed frequently, the EISA configuration information in flash ROM must necessarily be reprogrammed on a regular basis as boards or cards are added or changed. The present invention is directed at a method for reprogramming an EISA configuration block in certain types of flash ROM.

Instructions and data typically are stored in flash ROM in discrete sectors that can be identified by their addresses. For example, one present-day flash ROM manufactured by INTEL CORPORATION®, the INTEL 28F001BX-T (the "Intel flash ROM"), which is shown generally in FIG. 1, includes a memory array that is divided into four sectors, identified by INTEL CORPORATION® as sectors 0–3. In that four-sector Intel flash ROM, sector 0 is the largest sector of the memory array and is employed to store the main BIOS data. Sector 1 typically stores the Ediags diagnostic instructions and sector 2 stores the EISA configuration code. Boot code normally is stored in sector 3 of Intel's four-sector flash ROM.

In accordance with the specifications for the Intel flash ROM, the contents of this four-sector flash ROM can be erased by applying a 12 volt signal to a particular input of the flash ROM device and providing specific erase commands into the device's command register identifying the sector or sectors of flash ROM to be erased. After the erase operation, the Intel flash ROM device automatically enters a Command Mode, enabling new code to be written to the flash ROM device. When the flash ROM has been reprogrammed, the 12 volt signal is removed from the ROM input, and the content of the command register defaults to its read command, once again converting the Intel flash ROM to a read-only device. Causing the flash ROM to return to its read-only state is termed "reflashing" the ROM.

Originally, due to the nature and design of this and other prior art flash ROM devices, the entire memory array of the device had to be erased in order to erase any one sector. This exposed all of the instructions and data in the memory device to potential data loss or corruption (due to the erasure and reprogramming process) whenever any portion of the information needed to be erased and reprogrammed. For example, in instances where some of the Ediags instructions were to be reprogrammed but the boot code was to remain unchanged, the boot code nevertheless had to be erased and reprogrammed along with the new Ediags instructions. Inadvertent erasure or programming of the boot code has the potential for rendering an entire computer system nonfunctional.

A first solution to this shortcoming of prior flash ROM devices was to provide a separate flash ROM for storing the boot code. One obvious disadvantage to this practice was that at least two flash ROMs were required—one to store the boot code, and the other to store other program code and data. Another solution for protecting boot code, or certain other critical information, was the development of various flash memory array blocking techniques which allowed segregating different portions or sectors of stored information. In this way, when one portion needed to be erased, the other portion(s) did not have to be erased and rewritten, and were therefore not exposed to potential data loss or corruption. For example, a blocking technique was developed to preserve the boot code in the Intel four-sector flash ROM described above. This blocking technique included attaching a jumper and grounding a particular pin of the flash ROM. However, this Intel flash ROM still required a 12 volt power source for effecting the erase commands, as well as additional and costly related support circuitry necessary for providing and controlling that power source.

More recently, a new eight-sector flash ROM device has become available that is operable with only a 5 volt source. This eight-sector flash ROM, manufactured by ADVANCED MICRO DEVICES, INC.® as the Am29F010 (the "AMD flash ROM") is particularly desirable for use in microprocessor-based systems because it does not require the additional and expensive capacitors, transistors and circuitry necessary for supporting a 12 volt source.

The AMD flash ROM, however, is not immediately compatible with hardware supporting the Intel flash ROM. For example, in the eight-sector AMD flash ROM the boot code, the Ediag instructions, and the EISA configuration code all are stored together in the same sector of the memory array (sector 7), while the BIOS is stored in sectors 0–6, as compared to the Intel flash ROM, which stores boot code, Ediags instructions and EISA configuration code in separate sectors. While array blocking techniques are employed in the AMD flash ROM to permit discrete sectors of data and instructions to be selectively erased and rewritten, any alteration of the Ediag information, the boot code, or the EISA code requires that the other two be erased and then reprogrammed as well because an entire sector must be erased in its entirety. In addition, unlike the Intel flash ROM which automatically enters the Command Mode when 12 volts appears on the appropriate input line, the AMD flash ROM must be placed in the command mode by performing a sequence of instructions to a number of addresses in the AMD flash ROM. These addresses include locations across a variety of sectors of the AMD flash ROM.

It would be desirable to develop a method enabling existing support hardware in a PC to accommodate the AMD flash ROM. It would also be desirable to implement an AMD flash ROM that permits selective reprogramming of portions or segments of information contained in the same sector of a flash ROM memory array, particularly the EISA configuration information. It would be particularly advantageous to develop a methodology for modifying the EISA configuration code in a flash ROM device, such as the AMD flash ROM, without disturbing the other contents of the flash ROM, especially the boot code. Reprogramming EISA configuration code is governed, at least in some respects, by the EISA specifications. To reprogram the EISA configuration code in certain flash ROM devices, such as the AMD device, it is necessary to address portions of the main BIOS in other sectors of the flash ROM. Because of these complications, there has been a reluctance in the industry to use the 5 volt AMD device in a PC implementing an EISA bus system.

In commonly assigned, U.S. application Ser. No. 08/189, 534, a method was disclosed for reflashing the BIOS sectors 0–6 of the AMD flash ROM without disturbing the boot code. The teachings of that application are incorporated by reference herein. That invention, however, did not provide a method for reprogramming the EISA configuration code in sector 7 of the flash ROM without disturbing the other programs located in sector 7. Consequently, there currently is no accepted technique for implementing the 5 volt AMD flash ROM into a PC, EISA system.

SUMMARY OF THE INVENTION

Accordingly, there is provided herein a method of reprogramming a flash ROM, which includes both boot code and EISA configuration code stored in the same sector of the ROM device. The method permits modification of the EISA configuration code in the flash ROM while preserving the boot code and other code stored in the same sector of the memory array.

In accordance with the preferred embodiment, the present invention determines whether a 5 volt or 12 volt flash ROM forms part of the system, and if a 5 volt flash ROM is used, provides additional steps, as part of a modified interrupt routine. The modified interrupt routine monitors the interrupt functions being performed during set up and configuration of expansion boards in the EISA bus system to determine if an erase or write function is requested to the EISA configuration block in flash ROM.

If an erase or write function is detected as part of the interrupt, the present invention implements a specific routine to enable the CPU to enter a protected mode to perform necessary address command sequences required before the flash ROM device enters the command mode. In addition, during erase operations of the EISA configuration code, the CPU preferably reads the boot code and the Ediags instructions from sector 7 of the AMD flash ROM, and stores these codes in RAM. After sector 7 is erased, the boot code and Ediags instructions are automatically stored back in sector 7 of the flash ROM. During write operations, the CPU executes a routine to prevent code from being written accidently to the boot block in the flash ROM.

These and other characteristics and advantages of the present invention will become readily apparent to those skilled in the art upon reading the following detailed description and claims and by referring to the accompanying drawings.

BRIEF DESCRIPTION OF THE DRAWINGS

For a more detailed description of the preferred embodiment of the invention, reference will now be made to the accompanying drawings, wherein.

DESCRIPTION OF THE PREFERRED EMBODIMENT

In the following description, specific details are set forth, such as specific devices, part numbers, process steps, addresses, sequences, and the like, in order to provide a thorough understanding of the present invention. It will be apparent, however, to one skilled in the art that these specific details need not be employed to practice the present invention. For example, in the preferred embodiment the present method is implemented with an ADVANCED MICRO DEVICES, INC.® flash ROM, model no. Am29F010 ("AMD flash ROM"). The method of the present invention, however, is equally applicable to any nonvolatile memory device in which EISA configuration code is stored in a sector of the memory array that also is occupied by other data or program code. In other instances, well-known processing steps and device configurations are not described in detail in order not to obscure the present invention with a recitation of well known information.

One type of memory that is used in almost all personal computer systems is reprogrammable nonvolatile read only memory, which is referred to in this application as "flash ROM." The flash ROM can be programmed by a user, and once programmed, will retain the stored data and instructions until it is erased. Once programmed, the entire contents of the flash ROM can be erased in one relatively rapid operation. Alternatively, selected sectors of the flash ROM can be erased, but only in the entirety. That is, instructions or data stored on portions of sectors cannot be erased except by erasing the entire sector that contains that information. After erasure, the flash ROM then may be reprogrammed by writing new code or data to the flash ROM.

Figure 1:
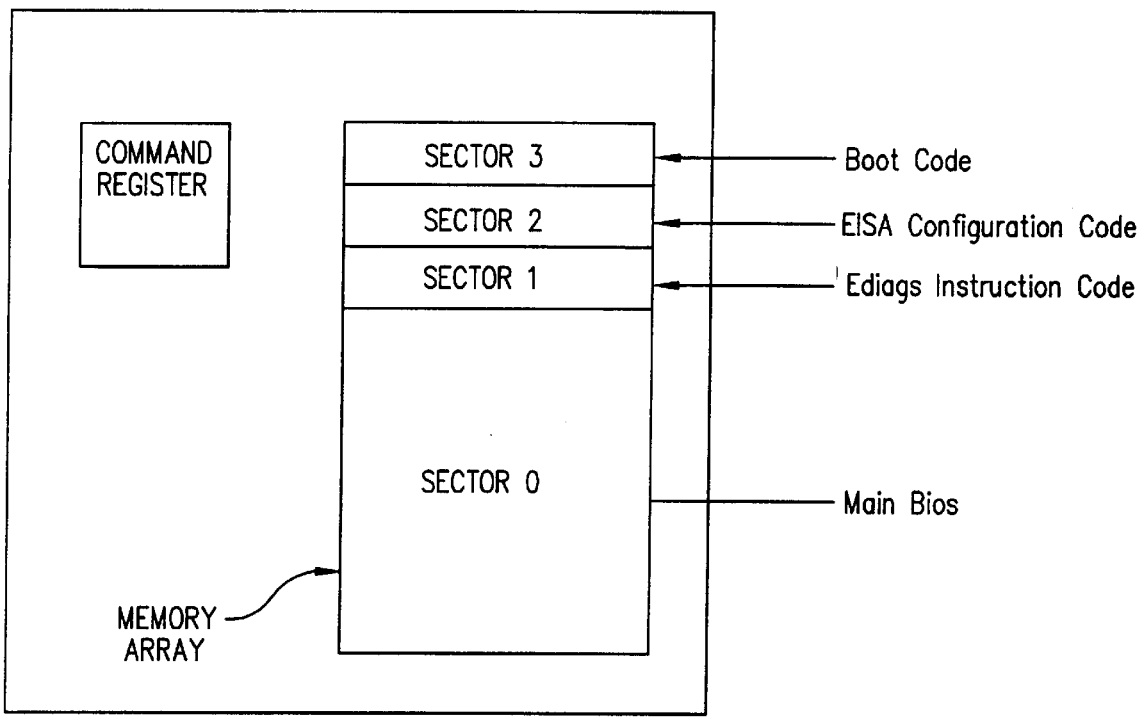
FIG. 1 is a block diagram of an Intel flash ROM with a four sector memory array.
Figure 2:
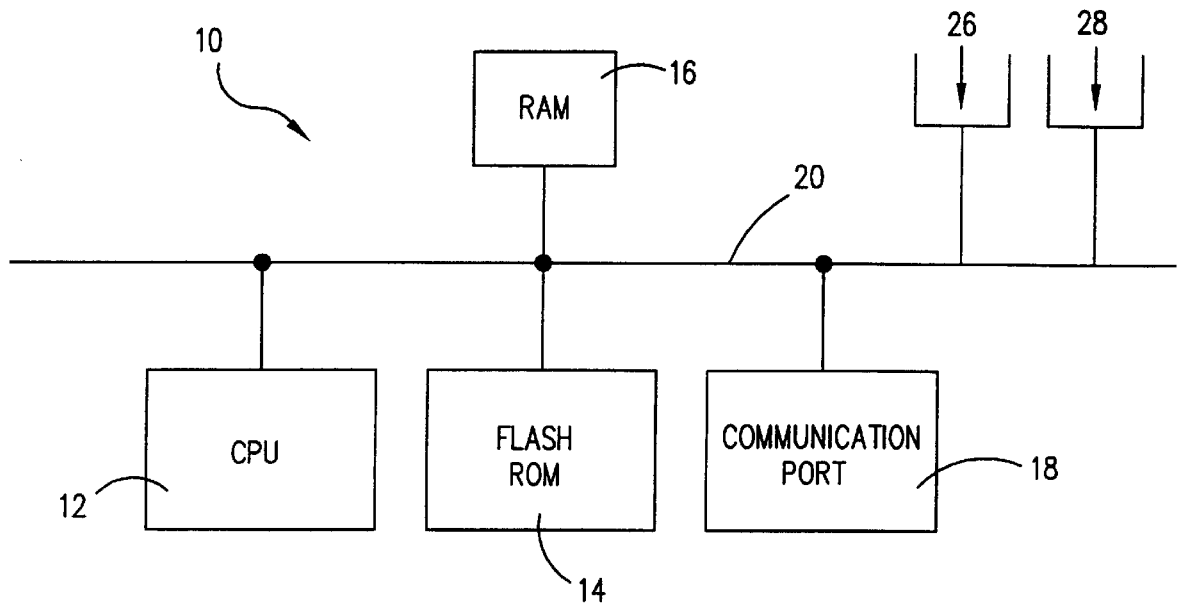
FIG. 2 is a block diagram of a microprocessor system employing a flash ROM capable of being reprogrammed by the method of the present invention.

Because flash ROMs are erasable and reprogrammable, they offer a cost-effective mechanism for storing and updating operating programs and data for the PC system. A central processing unit ("CPU") can reprogram a flash ROM. Such reprogramming is referred to as in-system writing ("ISW"). With ISW, the CPU controls the reprogramming of the flash ROM. FIG. 2 illustrates in block diagram form a microprocessor-based PC system 10 with ISW capability. PC system 10 includes a CPU 12, flash ROM 14 and RAM 16 that are interconnected in system 10 via system bus 20, which preferably comprises an EISA (Extended Industrial Standard Architecture) bus. The PC system also preferably includes a plurality of expansion slots 26, 28 for accommodating EISA expansion boards according to conventional techniques. A communication port 18 also is preferably provided that links the PC system 10 to an input device, such as keyboard or disc drive (not shown) via system bus 20.

Among its other functions, CPU 12 preferably performs the erasing and writing of flash ROM 14, and thus controls the reprogramming of flash ROM 14. Code that is to be programmed into the EISA configuration block in the flash ROM 14 preferably is provided as an input through the communication port 18 from the keyboard, disc drive, or other external device. Typically, the code will be input to the PC system as part of the set up and configuration program for a new expansion board for the EISA system.

As discussed in the Background of the Invention, an INTEL CORPORATION® flash ROM, the INTEL part no. 28F001BX-T ("Intel flash ROM") commonly is used as the read only memory component in PC systems. The Intel flash ROM is divided into four sectors, which typically store BIOS code in sector 0, Ediags code in sector 1, EISA configuration information in sector 2, and boot code in sector 4. Because of this arrangement, and because of certain procedures that are inherent to the INTEL® flash ROM, it is relatively easy to reprogram the EISA configuration code in the INTEL® device.

The present invention is designed for use in a PC system implementing flash ROM devices in which, unlike the Intel flash ROM, the EISA configuration code is stored in the same sector of the flash ROM as other programs, such as boot code, Ediags code, or some other code which it is desirable to maintain and preserve separate from EISA configuration code.

Figure 3:
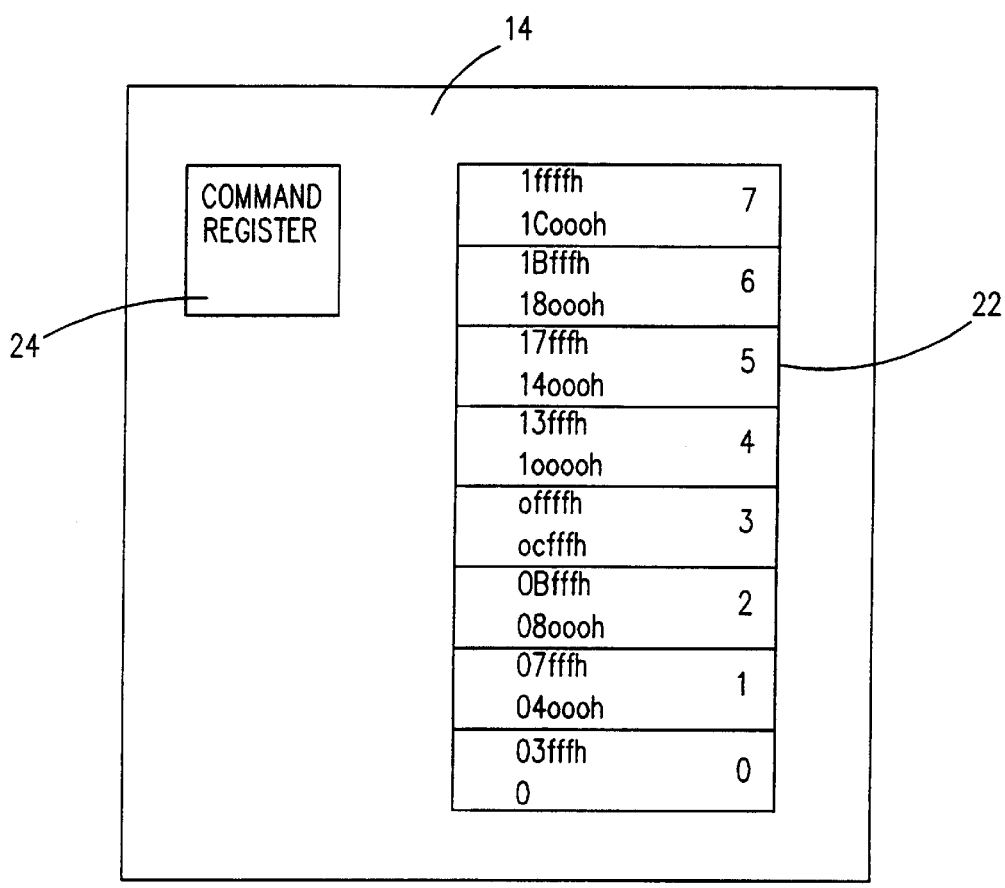
FIG. 3 is a block diagram of the eight sector AMD flash ROM shown in FIG. 2 in accordance with the preferred embodiment.

A block diagram of a flash ROM 14, constructed in accordance with the preferred embodiment is shown generally in FIG. 3. As shown therein, flash ROM 14 includes a memory array 22 comprised of memory cells that store information at designated addresses. As understood by those skilled in the art, flash ROM 14 further includes a command register 24 as well as a number of additional components including, for example, X and Y decoders, I/O buffers, timer, and switches. These various other components have not been shown in FIG. 3 as such depiction is unnecessary for an understanding and appreciation of the present invention.

In the preferred embodiment, memory array 22 of flash ROM 14 is divided into eight sectors, which may hereinafter be referred to as sectors 0–7. It is preferred that flash ROM 14 employ complementary metal oxide semiconductor ("CMOS") circuitry and that it be capable of being read, written to, erased and reflashed using a nominal 5 volt supply. One particularly preferred ROM 14 for practicing the present invention is the flash ROM manufactured by ADVANCED MICRO DEVICE, INC® ("AMD") designated by Family Part Number Am29F010, and described in AMD Publication No. 16736, Rev. C, Amendment/0, having Issue Date September 1992. Although other configurations for the memory arrays may be used without departing from the principles of the present invention, it is preferred that each sector 0–7 of flash ROM 14 include 16K bytes of memory, and that the sectors be divided according to the following addresses:

| | |
|---|---|
| Sector 7 | 1C000h-1FFFFh |
| Sector 6 | 18000h-1BFFFh |
| Sector 5 | 14000h-17FFFh |
| Sector 4 | 10000h-13FFFh |
| Sector 3 | 0C000h-0FFFFh |

-continued

| | |
|---|---|
| Sector 2 | 08000h-0BFFFh |
| Sector 1 | 04000h-07FFFh |
| Sector 0 | 00000h-03FFFh |

Four general categories of information are stored in flash ROM 14: (1) boot code, (2) EISA configuration code, (3) Ediags instructions, and (4) the main BIOS data. The boot code, the EISA configuration code and the Ediags instructions are stored together in sector 7 of the AMD flash ROM device. Main BIOS data is stored in flash ROM 14 in sectors 0–6.

The boot code, which is not generally intended to be frequently updated, typically includes information such as that used by CPU 12 for system initialization. The EISA configuration code typically includes configuration information to initialize the motherboard and the expansion boards that plug into the motherboard. This information may be frequently updated as expansion boards are added or removed from the system. EISA expansion boards typically include configuration files to permit the CPU to assign system resources while preventing conflicts between system components and expansion boards. The Ediags instructions include codes to initiate diagnostic programs for the CPU and related systems. In the preferred embodiment of ROM 14, boot code is stored in sector 7 at address 0x1e000h-0x1fffh, and self diagnosis instructions are preferably stored at address 1xc000h-1xcfffh in sector 7. The remaining portions of sector 7 preferably are reserved for the EISA configuration code, which comprises addresses 0x1d000h-0x1dfffh.

Figure 4A:
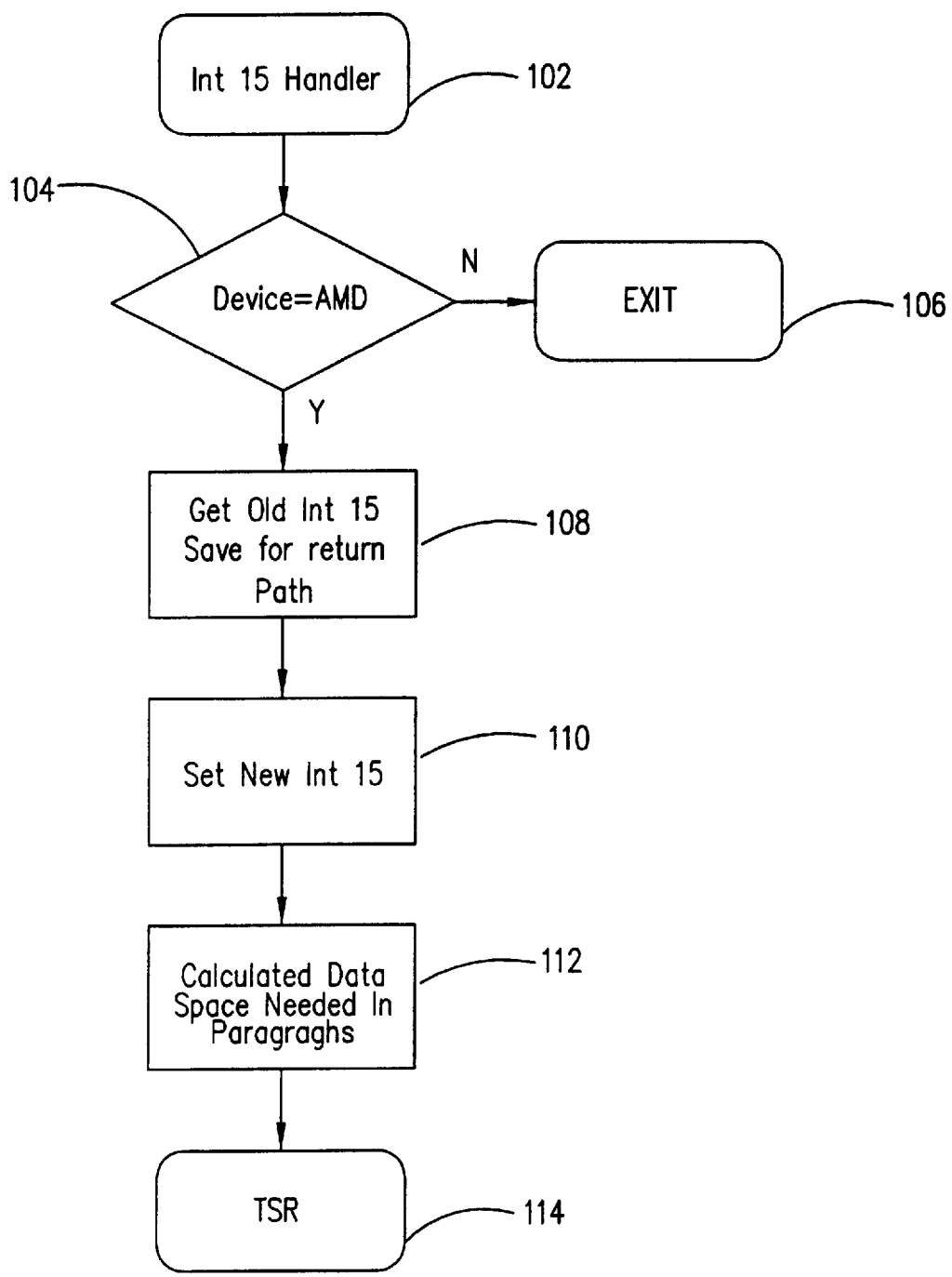
FIG. 4A–4B are flow charts describing the method of reprogramming the flash ROM in accordance with the preferred embodiment.

The present invention preferably provides a method of erasing or writing EISA configuration code in sector 7 of the AMD flash ROM without disturbing the other programs located in that sector. The methodology of the present invention will now be discussed with reference to FIGS. 4A–4B. Referring initially to FIG. 4A, the present invention preferably is used as part of a modified Interrupt 15 routine. Interrupt 15 comprises an interrupt service that is called for in the EISA Specifications, Version 3.12. Before proceeding with a description of the invention, some background information regarding interrupt routines is useful to an understanding of the present invention.

As one skilled in the art will understand, the ROM BIOS and the DOS operating system functions are made available to the PC system and to programs that are being executed in the PC system as interrupt routines. An interrupt is a signal to the CPU requesting service. The source of an interrupt signal typically is a hardware device in the PC system, such as a keyboard, or the signal can be generated through software by an executing program through an interrupt instruction. The interrupt signal typically includes an integer number, which is called the "interrupt number," such as Interrupt 15. The interrupt number is used by the CPU to determine precisely the service that is being requested. When a CPU receives an interrupt signal, it finishes executing the current instruction and begins executing the service program for the requested service that has been identified by the interrupt number. The service program is often referred to as the "interrupt handler." The service program or interrupt handler is located by looking up its address in an interrupt vector table, which typically comprises a plurality of 4 byte entries (called "interrupt vectors"). Each of the interrupt numbers corresponds to an interrupt vector, and each of the interrupt vectors identifies the address of the interrupt handler for the corresponding interrupt number.

The system software programs are normally installed in the system by updating the interrupt vector table. For ROM BIOS routines, this installation typically is performed during initialization. Initially, the interrupt vector table is empty, but entries are added to "point" to the different ROM service programs (or interrupt handlers). Subsequently, as DOS (or some other operating system) is loaded, the DOS service programs are installed in memory and new entries are added to the interrupt vector table, pointing to the DOS function programs. For service programs replacing or supplementing ROM BIOS programs, the programs are installed into memory and the interrupt table is updated accordingly. An application program needing service by a system function invokes the function by generating an interrupt signal with the appropriate interrupt number.

Referring again to FIG. 4A, the first step in the method of the present invention (step 102), therefore, is to install a new program for Interrupt 15 (Interrupt 15 is an interrupt routine specified in the EISA Specification Version 3.12), which preferably is performed when Interrupt 15 is initially called up. Normally, this would occur when the Interrupt is executed from a command line in DOS or during boot-up, if the command is placed in the boot program as part of an automatically executing program (AUTOEXEC in DOS).

As part of the installation procedure for the new Interrupt 15, and as shown in step 104, the CPU determines whether the flash ROM used in the PC system is an INTEL® device or an ADVANCED MICRO DEVICES® flash ROM. According to the preferred embodiment, the CPU performs this operation by checking if the flash ROM is a 5 volt device. If it is, the CPU considers it an AMD flash ROM device and continues on to step 108. If, conversely, the CPU decides that the flash ROM is not a 5 volt device, then the CPU deems it to be a 12 volt INTEL® flash ROM and exits from the program in step 106.

In step 108, the CPU retrieves the "old" Interrupt 15 routine and saves it for the end of the "new" Interrupt 15 routine (i.e., the "old" routine is tacked onto the end of the "new" routine). The CPU in step 110 then sets the address for the Interrupt 15 in the interrupt vector table equal to the location of the "new" Interrupt 15, that preferably comprises the subroutine of FIG. 4B. In step 112, the CPU determines how much space the program of the present invention will occupy by subtracting the beginning address of the program from the end address. The CPU performs a TSR (terminate and stay resident) operation in step 114 and informs the operating system of the address of the "new" Interrupt 15 and the amount of space occupied by that routine, so that the operating system will not attempt to take that space in memory.

Figure 4B:
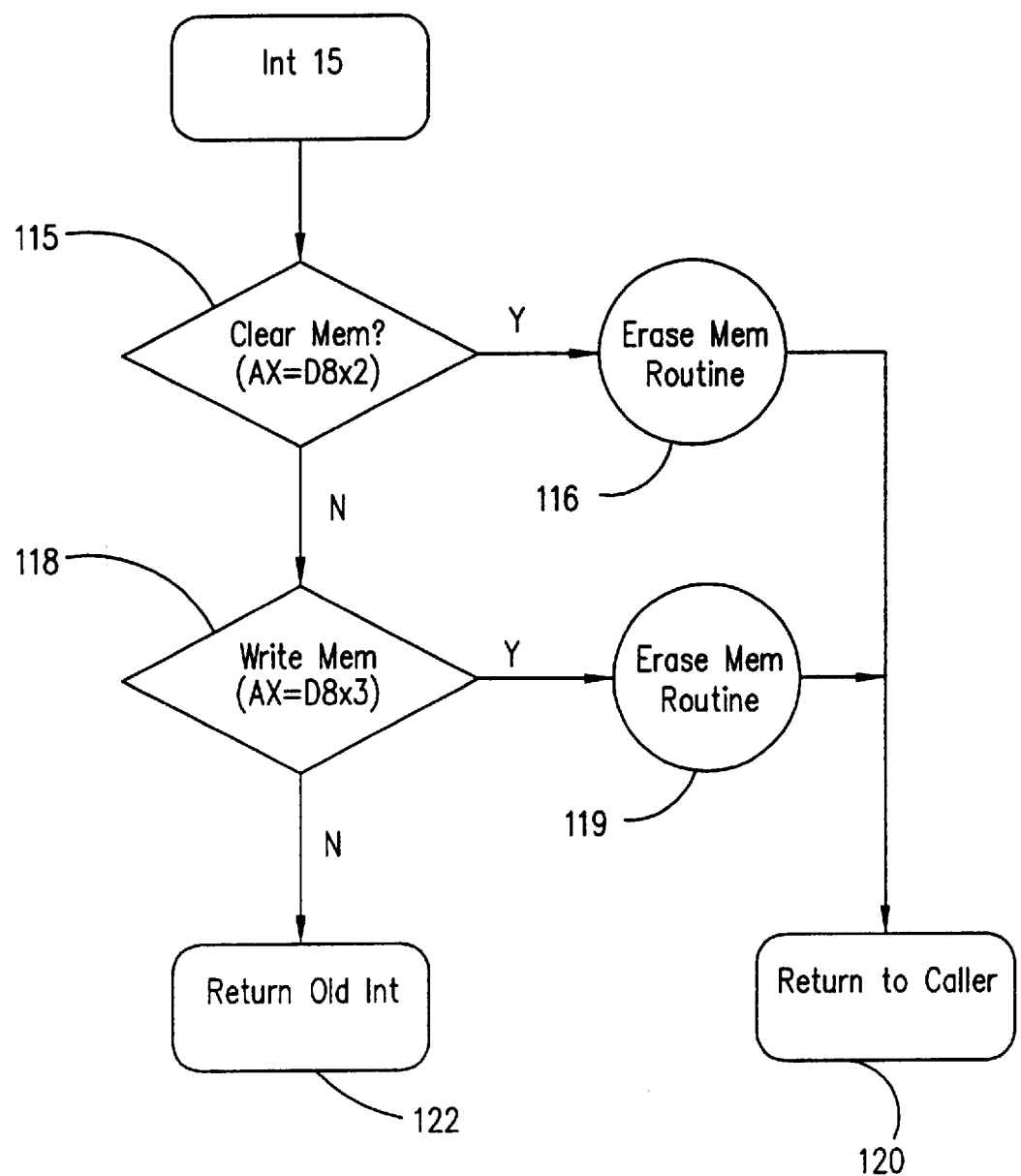

According to Version 3.12 of the EISA Specifications, Interrupt 15 has a number of different functions. The present invention focuses on two of the functions of Interrupt 15: (1) erase EISA configuration code in the flash ROM and (2) write to the EISA configuration code in flash ROM. See EISA Specification, Version 3.12, §§ 4.8.1.4, 4.8.1.5, at pages 388–389. Referring now to FIG. 4B, after the "new" Interrupt 15 is installed according to the method of FIG. 4A, the subroutine of FIG. 4B is called up whenever an Interrupt 15 is executed either through hardware (i.e., the keyboard) or through software (an executing program), such as when an expansion card is installed and a set-up program is run. When the CPU sees that an Interrupt 15 is being executed, the CPU checks to determine whether an erase function or a write function is being implemented through the method of "new" Interrupt 15. If neither an erase function or a write function is occurring as part of Interrupt 15, then the CPU returns to the "old" Interrupt 15.

When the caller makes an Interrupt 15 call, it must first set up certain registers. One of those registers is register AX, which operates according to the preferred embodiment as a function register. Register AX preferably comprises a 16 bit register, that according to normal convention is subdivided into two registers, AH and AL, which stand for high part and low part. Thus, AH comprises bits 8–15 and AL comprises bits 0–7 of register AX.

In the subroutine of FIG. 4B, the CPU in step 115 checks the status of register AX to determine if the contents of register AX equal D8x2h, where the upper half of register AX (commonly called AH) correspond in hexadecimal notation to D8, and the contents of the lower half of register AX (commonly called AL) correspond to x2 in hexadecimal notation (where the symbol x indicates that any value in the first four bits of AL is acceptable provided that the last four bits correspond to a hexadecimal 2, which as one skilled in the art will understand corresponds to a binary value of 0010). If the CPU determines that the contents of register AX equal D8x2 in hexadecimal notation, then the CPU branches to step 116 and calls up the Erase Memory routine of FIGS. 5A–5B. If the contents of register AX do not equal D8x2, then in step 118 the CPU checks register AX to determine if the contents equal D8x3. If so, the CPU branches to the subroutine of FIG. 6 in step 119 where the Write Memory routine is initiated.

If either the Erase Memory routine or Write Memory routine is called up, then the program of FIG. 4B ends in step 120, after the routine is completed, by returning to the caller. If the contents of register AX do not equal either D8x2 or D8x3, then the CPU returns to the "old" Interrupt 15 in step 122 since neither an erase or a write function is to be executed.

Figure 5A:
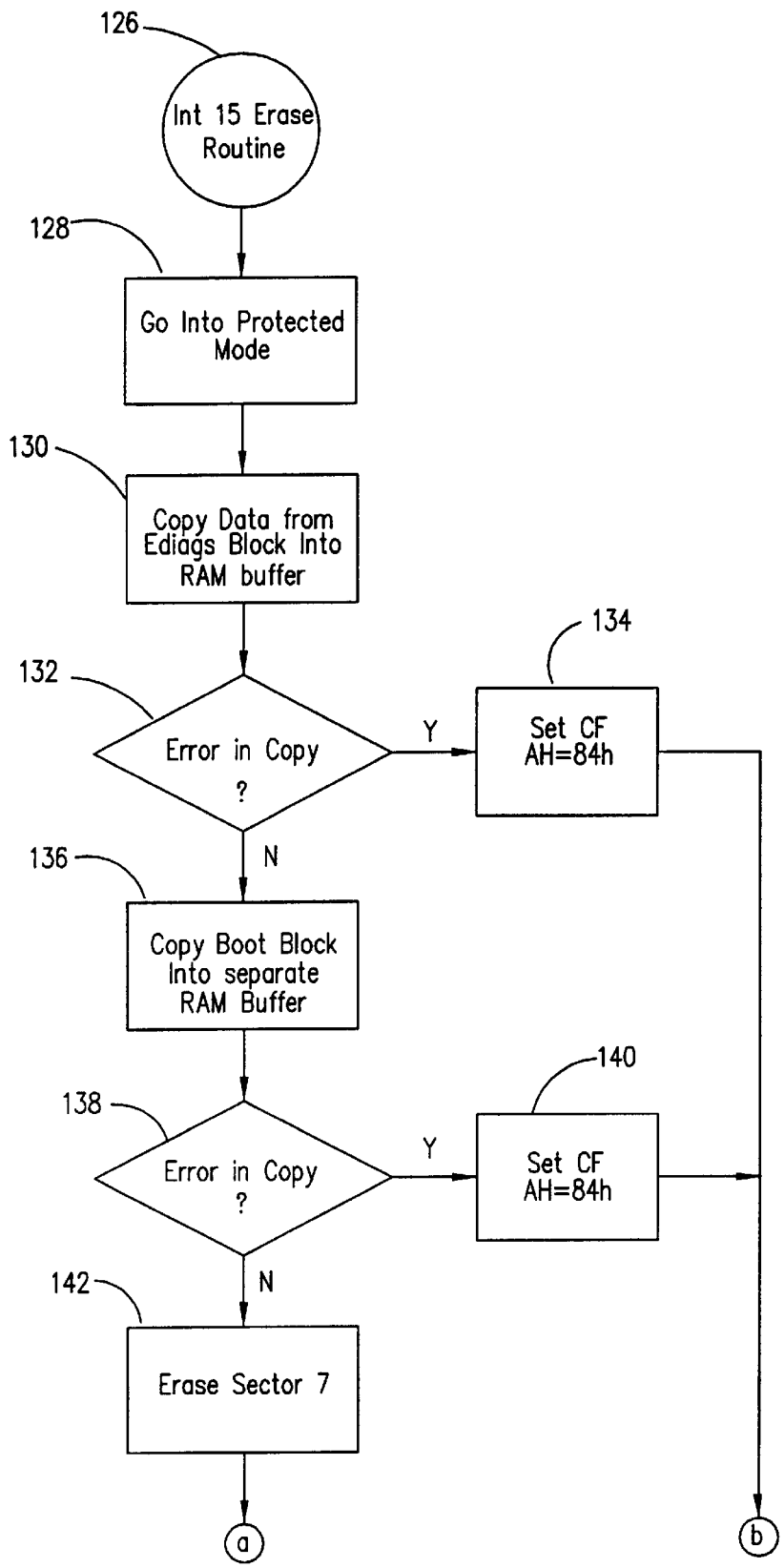
FIGS. 5A–5B show a flow chart illustrating the Erase Memory subroutine of FIG. 4B.
Figure 5B:
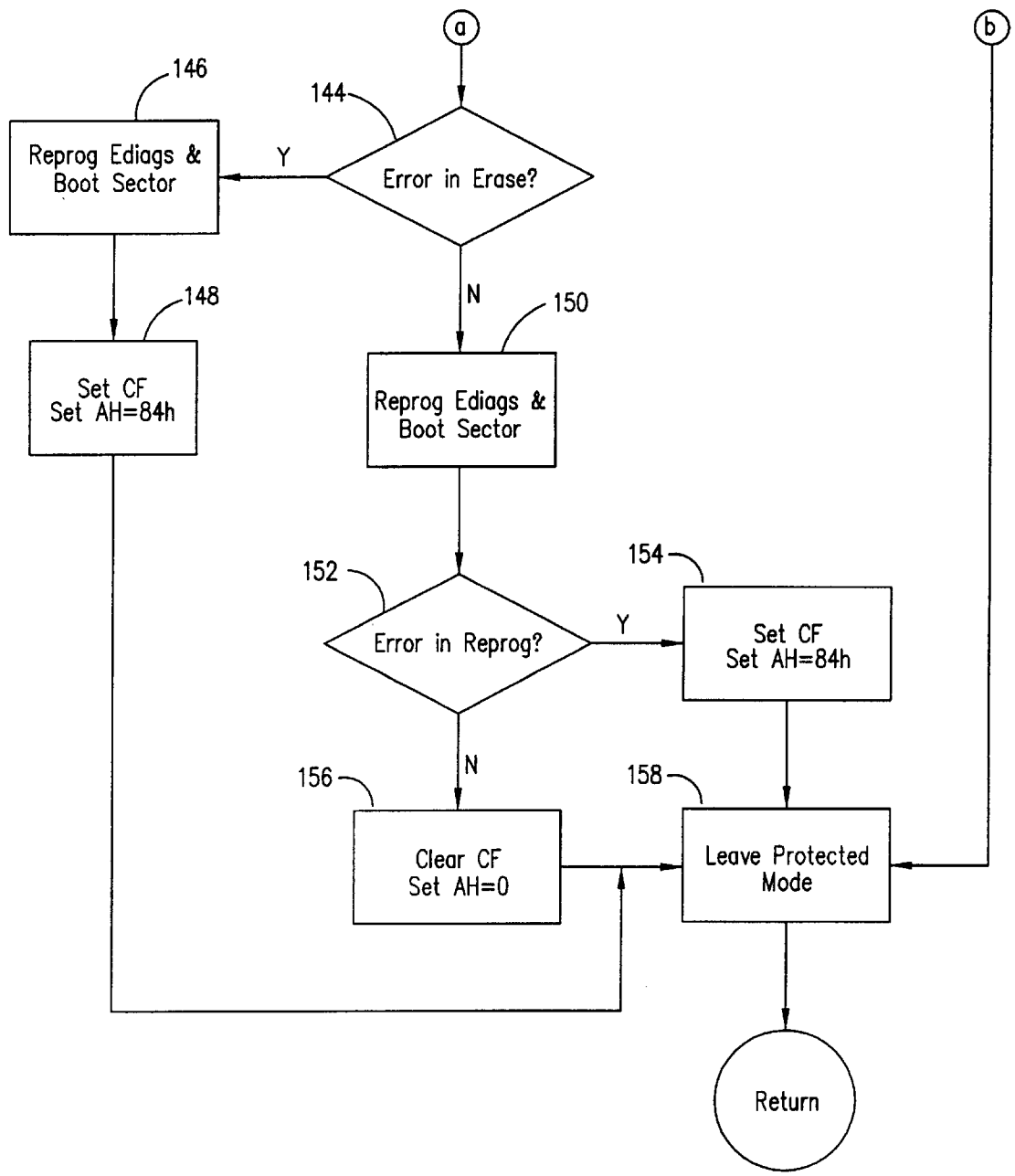

Referring now to FIGS. 5A and 5B, the Erase Memory routine will now be described in accordance with the preferred embodiment. If the CPU determines that the contents of register AX equal D8x2 (in step 115 of FIG. 4B), then the CPU calls up the Erase Memory routine, which is initiated in step 126 according to conventional techniques. In step 128, the CPU preferably enters the "protected mode." As one skilled in the art will understand, the "real mode," which more precisely is the "real address mode" mimics the basic 8086 microprocessor architecture with a 20 bit address, and registers that primarily are 16 bits wide. Conversely, the "protected virtual address mode" or "protected mode" has several different modes, including one with a full 32 bit structure (32 bit address bus and 32 bit operands). The "protected mode" therefore, permits the CPU to execute 32 bit addresses, while in the "real mode" the CPU is essentially restricted to executing addresses using only 16 bits.

Before a flash ROM device can be reprogrammed, it typically must first be placed in a Command Mode. The necessity of proceeding in a 32 bit protected mode in the present invention is mandated by the command sequence of the ADVANCED MICRO DEVICES® flash ROM (the AMD 28F001) before that device will enter the Command Mode. In the INTEL CORPORATION® 28F001BX-T flash ROM, the flash ROM is automatically placed in the Command Mode when the contents of the device are cleared by placing 12 volts on the appropriate input line. The INTEL® flash ROM device, therefore, can be instructed to erase one or more sectors, or the entire contents of memory, by writing a series of command signals, without addressing the command signals to any particular location in the flash ROM. To erase a sector (or the entire contents of the ROM), or to reprogram a sector in the AMD flash ROM, a series of command signals must be sent to a specific sequence of addresses, which may be located in different sectors of the flash ROM, before the AMD device will enter the Command Mode. See the specifications of the AMD 28F001. Because the AMD flash ROM requires a sequence of commands to various addresses in multiple sectors of the ROM, the preferred embodiment of the present invention places the CPU in the "protected mode" to provide enough bits to generate command signals that span addresses in various sectors of the flash ROM, as required for the AMD device.

After the CPU enters the protected mode in step 128, the CPU preferably saves the contents of sector 7 of the flash ROM, other than the EISA configuration code, before erasing the contents of that sector (the smallest portion of ROM that can be erased is a sector). Thus, in step 130 the CPU copies data from the Ediags block in sector 7 of the flash ROM into a memory buffer, such as RAM. The CPU then preferably determines in step 132 whether an error was made when copying the Ediags block from ROM to RAM, by comparing the data in these two memories. If an error is found, then in step 134 the CPU preferably sets the carry flag ("CF"), which is a status flag in the flags register, and also sets the contents of the upper half of register AX (which commonly is referred to as AH) equal to 84 in hexadecimal code, which according to the EISA Specification, Version 3.12, § 4.8.1.5 at page 389 signifies that a system error occurred with the nonvolatile memory. The CPU then leaves the protected mode in step 158 and returns to the program of FIG. 4B.

If the Ediags block is copied properly, the CPU in step 136 preferably copies the boot block from sector 7 of the flash ROM into a contiguous space in RAM, which is separate from the location where the Ediags block is stored. In step 138, the CPU verifies that the boot block was copied properly to RAM. Once again, in step 140 the CPU sets the carry flag CF and sets the upper half of register AX (AH) equal to 84 h if an error occurred in copying the block from flash ROM to RAM. After the error signal is written to register AX, the CPU then leaves the protected mode in step 158 and routines to the program of FIG. 4B.

If both the Ediags block and the boot code have been successfully copied to RAM, the CPU in step 142 erases sector 7 of the flash ROM by performing the necessary command sequence required by the AMD specifications to place the AMD flash ROM into Command Mode. After the AMD flash ROM enters the Command Mode, the CPU erases the boot code, the Ediags information, and the EISA configuration code from sector 7. Once the contents of sector 7 have been erased, the CPU checks to determine if an error occurred in the erase operation in step 144. If an error is detected by the CPU, the CPU reprograms the Ediag block and the boot block in step 146 by copying back into sector 7 of the flash ROM the information previously copied to RAM, which comprises the Ediags instructions and the boot block. According to the AMD specifications, the reprogramming occurs by transmitting a sequence of commands to the flash ROM, followed by the address of the location in ROM to be reprogrammed, and then sending the byte of data to be stored at that address. After the byte is sent, the CPU checks the contents of the byte to make sure the data was properly written to the desired location in ROM. This procedure must be repeated in the AMD flash ROM for each byte to be reprogrammed. After the Ediag block and the boot block have been copied back to flash ROM in step 146, the CPU sets the carry flag CF and sets the upper half of register AX (AH) equal to 84 in hexadecimal notation in step 148 to indicate that an error occurred when writing nonvolatile memory. After setting the carrier flag and the contents of register AX, the CPU leaves the protected mode in step 158 and returns to the program of FIG. 4B.

If no error occurs in the erase operation, the CPU in step 150 reprograms the Ediags block and the boot block to the flash ROM, in substantially the same manner as described with respect to step 146. The CPU then checks for any errors in reprogramming in step 152 by comparing the Ediags block and the boot block stored in RAM with the reprogrammed contents of flash ROM. If an error is detected, the carry flag CF is set and the upper half of register AX (AH) is set equal to a hexadecimal 84 in step 154. The CPU then leaves the protected mode in step 158.

If the CPU does not find any errors in the reprogramming, the CPU clears the carry flag in the flag register and sets the upper half of register AX (AH) equal to 00 h in step 156 to signify a successful completion of the erase operation. See EISA Specification Version 3.12, § 4.8.1.5, at 389. The CPU then leaves the protected mode in step 158 and returns to the program illustrated in FIG. 4B.

Figure 6:
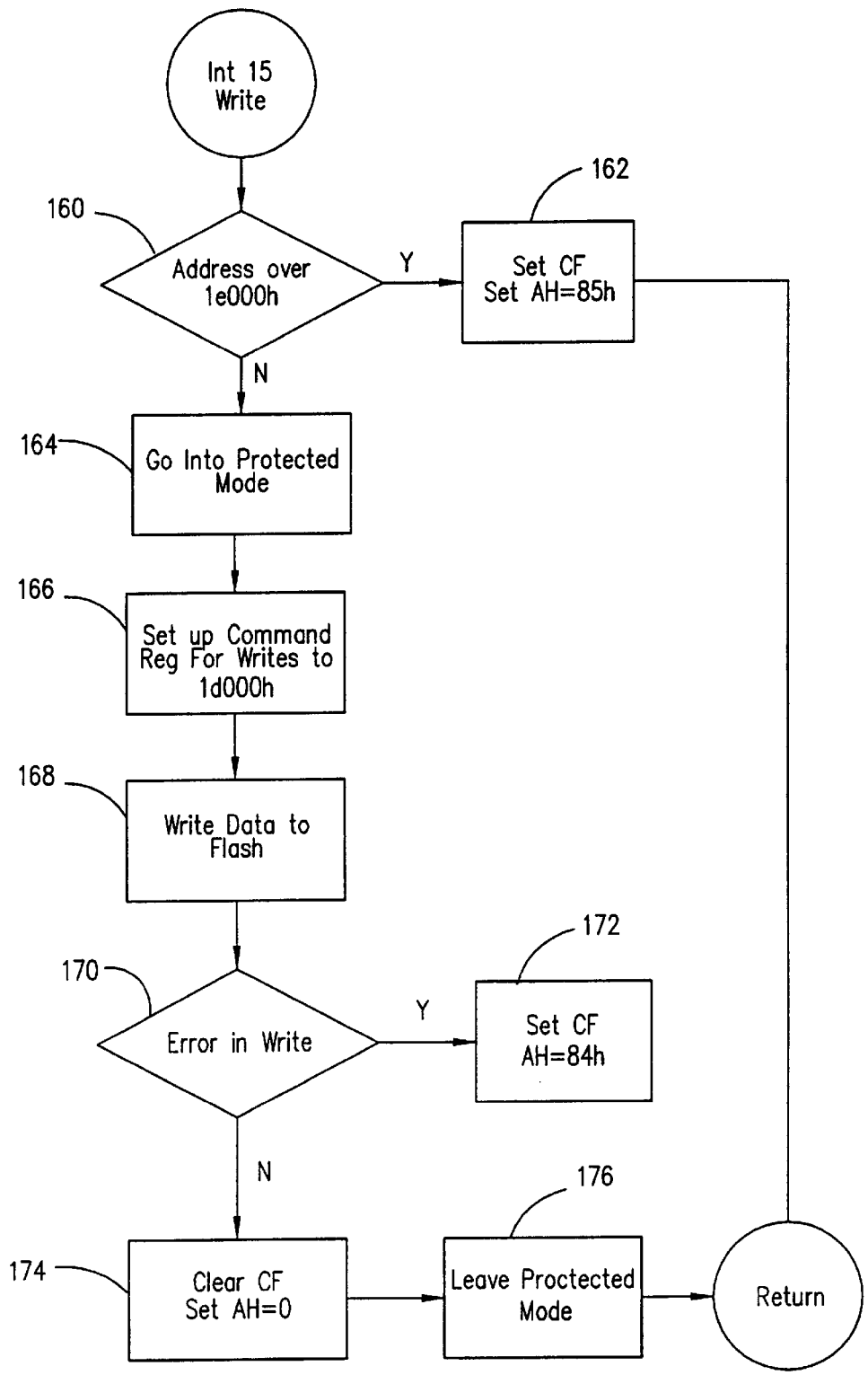
FIG. 6 is a flow chart depicting the Write Memory subroutine of FIG. 4B.

Referring now to FIG. 6, the Write Memory routine will now be described in accordance with the preferred embodiment. When a Write function is detected by the CPU in step 118 of FIG. 4B, the CPU branches to the subroutine illustrated in FIG. 6. In step 160 the CPU checks the address of the write instruction to determine if the address is over 1e000h, which is the address of the boot block. If the caller attempts to write to the boot block, the CPU in step 162 sets the carry flag CF in the flag register and sets the upper half of register AX (AH) equal to 85 in hexadecimal notation to indicate that the original calling routine had an error. The CPU then returns to the program of FIG. 4B.

If the address of the write instruction is not addressed to the boot block, the CPU in step 164 enters the 32 bit protected mode to permit the CPU to formulate addresses outside of the EISA configuration code addresses, as required in the AMD command protocol. In step 166, the CPU goes into a command mode set up by performing the command sequence necessary to write to address 1d000h of the flash ROM (which is the start of the EISA configuration code block), which according to the AMD specification includes executing the command sequence to place the AMD flash ROM into Command Mode, followed by the address of the EISA configuration code (1d000h). After the flash ROM is placed in the Command Mode, and after the address of the EISA configuration block is selected, the CPU writes the data to that address in step 168.

In step 170, the CPU checks to determine whether any errors occurred in the write operation to the EISA configuration block in sector 7 of the flash ROM. If an error is detected, the CPU sets the carry flag CF in the flag register and sets the upper half of register AX (AH) equal to 84 h in step 172. If no error is detected, the CPU in step 174 clears the carry flag CF and sets the upper half of register AX (AH) equal to 00 h. The CPU then leaves the protected mode in step 176 and returns to the program of FIG. 4B.

In the foregoing specification, the invention has been described with reference to the presently preferred embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A method of reprogramming a portion of a sector in a flash ROM device, which is included in a PC system that includes RAM, wherein the sector includes at least two different programs, one of which is to be reprogrammed and one of which is not to be disturbed, the method comprising the steps of:
   (a) determining whether the flash ROM device is reprogrammed using five volts or twelve volts;
   (b) responsive to a determination that the flash ROM device is reprogrammed using five volts:
      (b)(1) detecting a write function request to the sector of flash ROM;
      (b)(2) monitoring the address of the write request to prevent a write to the portion of the sector that is not to be disturbed;
      (b)(3) placing the flash ROM in a Command Mode; and
      (b)(4) writing the data to the portion of flash ROM which is to be reprogrammed.

2. The method of claim 1 wherein the flash ROM is a five volt AMD flash ROM device.

3. The method of claim 1 wherein the step of placing the flash ROM into a Command Mode (step (b)(3)), includes the step of:
   placing the PC system into a protected mode.

4. The method of claim 3, wherein the step of placing the flash ROM into a Command Mode (step (b)(3)) includes the step of:
   transmitting a sequence of command signals to various addresses in the flash ROM.

5. The method of claim 1, wherein the portion of the sector to be reprogrammed comprises the EISA configuration code.

6. The method of claim 5, wherein the portion of the sector which is not to be disturbed comprises the boot code.

7. The method of claim 1, wherein the step of detecting the write function (step (b)(1)) includes the steps of:
   monitoring Interrupt 15; and
   checking register AX to determine if the contents of register AX equal D8x3.

8. A method of reprogramming a flash ROM that includes a multi-sector memory array having boot code and EISA configuration code stored in the same sector of the ROM's's memory array the method comprising the steps of:
   (a) determining whether flash ROM is reprogrammed using five volts;
   (b) if said flash ROM is reprogrammed using five volts:
      (b)(1) installing a new Interrupt 15 routine in place of an old Interrupt 15 routine;
      (b)(2) executing the new Interrupt 15 routine whenever an Interrupt 15 is requested;
      (b)(3) monitoring the Interrupt 15 request for an erase or write function; and
      (b)(4) executing an erase or write routine in response to the presence of an erase or write function.

9. The method of claim 8 further comprising saving the address of the old Interrupt 15 routine to the end of the new Interrupt 15 routine.

10. The method of claim 8, wherein the step of monitoring the Interrupt 15 request includes monitoring the contents of a function register (AX).

11. The method of claim 10, wherein the step of executing an erase or write routine only occurs if the contents of the function register (AX) equal D8x2 or D8x3.

12. The method of claim 11, wherein an erase routine is executed if the contents of the function register (AX) equals D8x2.

13. The method of claim 12, wherein the erase routine includes the steps of copying the boot code to a memory buffer before the sector is erased, and copying the boot code back to the sector in flash ROM after the sector is erased.

14. The method of claim 11, wherein a write routine is executed if the contents of the function register (AX) equals D8x3.

15. The method of claim 14, wherein the write routine includes the steps of monitoring the address of the write function and setting an error flag if the address includes the boot code address.

16. A method of reprogramming EISA configuration code in an AMD flash ROM device, wherein the flash ROM is divided into eight memory array sectors, and said EISA configuration code is stored in a single sector of the flash ROM together with boot code and Ediags instruction code, said method comprising the steps of:

(a) initializing an Interrupt 15 routine;

(b) determining if the flash ROM is reprogrammable using five volts;

(c) modifying the Interrupt 15 routine in response to an affirmative determination in step b;

(d) monitoring Interrupt 15 requests for the presence of an erase or a write function to EISA configuration code;

(e) entering a 32 bit protective mode in response to the presence of an erase or write function in the Interrupt 15 request;

(f) placing the flash ROM in a Command Mode by transmitting a sequence of command signals to various addresses in the flash ROM device;

(g) erasing or writing to the EISA configuration code in the designated sector.

17. The method of claim 16, wherein the Ediags instruction code and the boot code are read to a memory buffer before the designated sector is erased, and then is written back to the designated sector after the erase operation is complete.

18. The method of claim 17, wherein the step of writing to EISA configuration code includes monitoring the address of a write instruction for any attempts to write to the boot code, and generating an error signal if the write instruction attempts to write to the address occupied by the boot code.

* * * * *